(12) United States Patent
Rassega et al.

(10) Patent No.: US 9,157,936 B2
(45) Date of Patent: Oct. 13, 2015

(54) HANDHELD DEVICE FOR DETECTING TAMPERING AIMED TO MODIFY THE METERING OF MEASURE-DELIVERABLE GOODS OR SERVICES AND INSPECTION METHOD

(75) Inventors: Yuri Giuseppe Rassega, Rome (IT); Stefano Pancotto, Rome (IT)

(73) Assignee: ENEL DISTRIBUZIONE S.P.A., Rome (IT)

( * ) Notice: Subject to any disclaimer, the term of this patent is extended or adjusted under 35 U.S.C. 154(b) by 150 days.

(21) Appl. No.: 13/985,132

(22) PCT Filed: Feb. 24, 2012

(86) PCT No.: PCT/EP2012/053178
§ 371 (c)(1),
(2), (4) Date: Oct. 25, 2013

(87) PCT Pub. No.: WO2012/113916
PCT Pub. Date: Aug. 30, 2012

(65) Prior Publication Data
US 2014/0049404 A1    Feb. 20, 2014

(30) Foreign Application Priority Data

Feb. 25, 2011   (EP) ..................................... 11425047

(51) Int. Cl.
| | |
|---|---|
| G08B 21/00 | (2006.01) |
| G08B 13/24 | (2006.01) |
| G08B 13/18 | (2006.01) |
| H04M 11/00 | (2006.01) |

(Continued)

(52) U.S. Cl.
CPC .............. *G01R 11/24* (2013.01); *G01R 22/066* (2013.01)

(58) Field of Classification Search
CPC ........................................................ G01R 11/24
USPC ...................................................... 340/870.16
See application file for complete search history.

(56) References Cited

U.S. PATENT DOCUMENTS 5,617,084 A * 4/1997 Sears ........................ 340/870.02
5,910,774 A * 6/1999 Capriotti et al. .............. 340/637

(Continued)

FOREIGN PATENT DOCUMENTS

EP      1607752      12/2005

OTHER PUBLICATIONS

PCT International Search Report mailed on Apr. 3, 2012 for PCT Application PCT/EP2012/053178 filed on Feb. 25, 2012 in the name of Enel Distribuzione S.P.A.

(Continued)

*Primary Examiner* — Jennifer Mehmood
*Assistant Examiner* — John Mortell
(74) *Attorney, Agent, or Firm* — Steinfl & Bruno LLP (57) ABSTRACT

A detecting device, for facilitating a detection of tampering aimed at altering a metering of a measure-deliverable good or service, for providing useful information for detecting a presence of a remotely activated/deactivated tampering device by means of a radiofrequency control signal, the tampering device comprising a radio receiver of said radio frequency signal is described. The detecting device is a handheld device. The detecting device has at least one radiofrequency probe, provided with an antenna, and a signal processing circuit such as to receive a electric radiofrequency signal for providing, based on said signal, useful information for detecting the presence of a receiver.

15 Claims, 6 Drawing Sheets

(51) Int. Cl.
*G01R 11/24* (2006.01)
*G01R 22/06* (2006.01)

(56) References Cited

U.S. PATENT DOCUMENTS

| | | | |
|---|---|---|---|
| 6,181,257 B1 * | 1/2001 | Meek et al. | 340/870.01 |
| 6,512,463 B1 * | 1/2003 | Campbell et al. | 340/870.02 |
| 2004/0021568 A1 * | 2/2004 | Seal et al. | 340/551 |
| 2008/0272933 A1 * | 11/2008 | Cahill-O'Brien et al. | 340/870.02 |
| 2010/0176967 A1 * | 7/2010 | Cumeralto et al. | 340/870.02 |
| 2012/0056755 A1 * | 3/2012 | Hanft | 340/870.07 |
| 2012/0331092 A1 * | 12/2012 | Cornwall | 709/217 |

OTHER PUBLICATIONS

PCT International Preliminary Report on Patentability completed on Apr. 29, 2013 for PCT Application PCT/EP2012/053178 filed on Feb. 25, 2012 in the name of Enel Distribuzione S.P.A.

PCT Written Opinion mailed on Apr. 3, 2012 for PCT Application PCT/EP2012/053178 filed on Feb. 25, 2012 in the name of Enel Distribuzione S.P.A.

Response filed on Apr. 5, 2013 to PCT International Preliminary Report on Patentability for PCT Application PCT/EP2012/053178 filed on Feb. 25, 2012 in the name of Enel Distribuzione S.P.A.

* cited by examiner

HANDHELD DEVICE FOR DETECTING TAMPERING AIMED TO MODIFY THE METERING OF MEASURE-DELIVERABLE GOODS OR SERVICES AND INSPECTION METHOD

CROSS REFERENCE TO RELATED APPLICATIONS

The present application is the US national stage of International Patent Application PCT/EP2012/053178 filed on Feb. 24, 2012 which, in turn, claims priority to European Patent Application EP 11425047.5 filed on Feb. 25, 2011.

The present invention refers to the technical field of detectors for detecting illicit tampering and more particularly to a handheld detecting device for detecting tampering aimed to modify the metering of measure-deliverable goods and services.

As is known, the industrial sector of distribution of measure-deliverable goods and services, comprising for example electrical energy, water and gas distribution utilities, is affected by the problem of loss of income due to illicit direct/indirect tampering by users of meters provided at the delivery points in the distribution network. In the present description, the term "direct tampering" refers to tampering which alters the physical structure or the metering ability of the utility meter, whereas "indirect tampering" refers to tampering such as the introduction of branching or bypass connections allowing illicit tapping of goods or services, which is not detected by the utility meter.

As is known, said the above indicated utility meters are provided for monitoring actual consumption and record and provide measurements, which are used by utilities for billing purposes. Such tampering are committed by users in order to illicitly alter the metering with respect to actual consumption. This problem is particularly although not exclusively felt when meters are of the so called automatic reading type, also known as AMR (Automatic Reading Modules).

In order to detect, signal or prevent such tampering, utility meters are developed which are provided with more innovative and efficient anti-tampering devices. A known anti-tampering device is for example described in the European patent application no. EP 1 607 752. At the same time, tampering methodologies, strategies, and tools become more and more sophisticated and since it is almost impossible to prevent or precisely identify such tampering, or tampering exploits, by integrating security devices into the utility meters, the utilities have developed analysis tools and control methods which allow the detection and signaling of anomalies in the consumption metering. Tampering alerts may also be provided by the same utility meter, as described, for example, in above said patent EP 1 607 752.

Based on such alerts, the utilities may dispatch specialized operators on site, in order to visually inspect and ascertain the proper operation of meter or proper condition of network at the distribution point, for example by verifying that the meter does not show visible signs of tampering and/or by verifying coherence of metering with respect to measurements provided by a reference measurement instrument provided by operators.

The applicant, active in the specific sector of electrical energy distribution, by constantly monitoring the network and consumption patterns, has identified certain illicit tampering typologies which cannot be detected by means of a visual inspection or coherence test, and has discovered that such tampering is based on tampering or altering devices which are remotely activated/deactivated by means of a remote control. Such devices allow a user to revert the utility meter or the network configuration at the distribution point to a normal status, before specialized operators arrive on site for inspection purposes.

A first type of tampering which has been identified by applicant is based on illicit installation inside the utility meter of a consumption metering altering device, which may be activated or deactivated by remote control, which reduces, by means of an electronic circuit, the metering recorded by the meter. Based on above said definition, such tampering represents a direct tampering of the utility meter.

A second type of tampering identified by applicant consists of illicit provision of an electrical bypass connection of utility meter, which may be activated/deactivated by means of a remote control. Therefore, such tampering is a network configuration tampering, near the delivery point, and represents an indirect tampering of utility meter.

The object of the present invention is to provide a detecting device for identifying direct or indirect illicit tampering of meters, obtained by remotely controlled tampering devices.

This object is achieved by a detecting device as generally defined in claim 1. Preferred and advantageous embodiments of said detecting device are defined in the annexed dependent claims.

The present invention also refers to an inspection method as defined in claim 15.

The invention will be more clearly understood in the following detailed description of its embodiments, which are illustrative and therefore not limiting, with reference to attached drawings, wherein.

In the figures, same or similar elements are indicated by same reference numerals.

Figure 1:
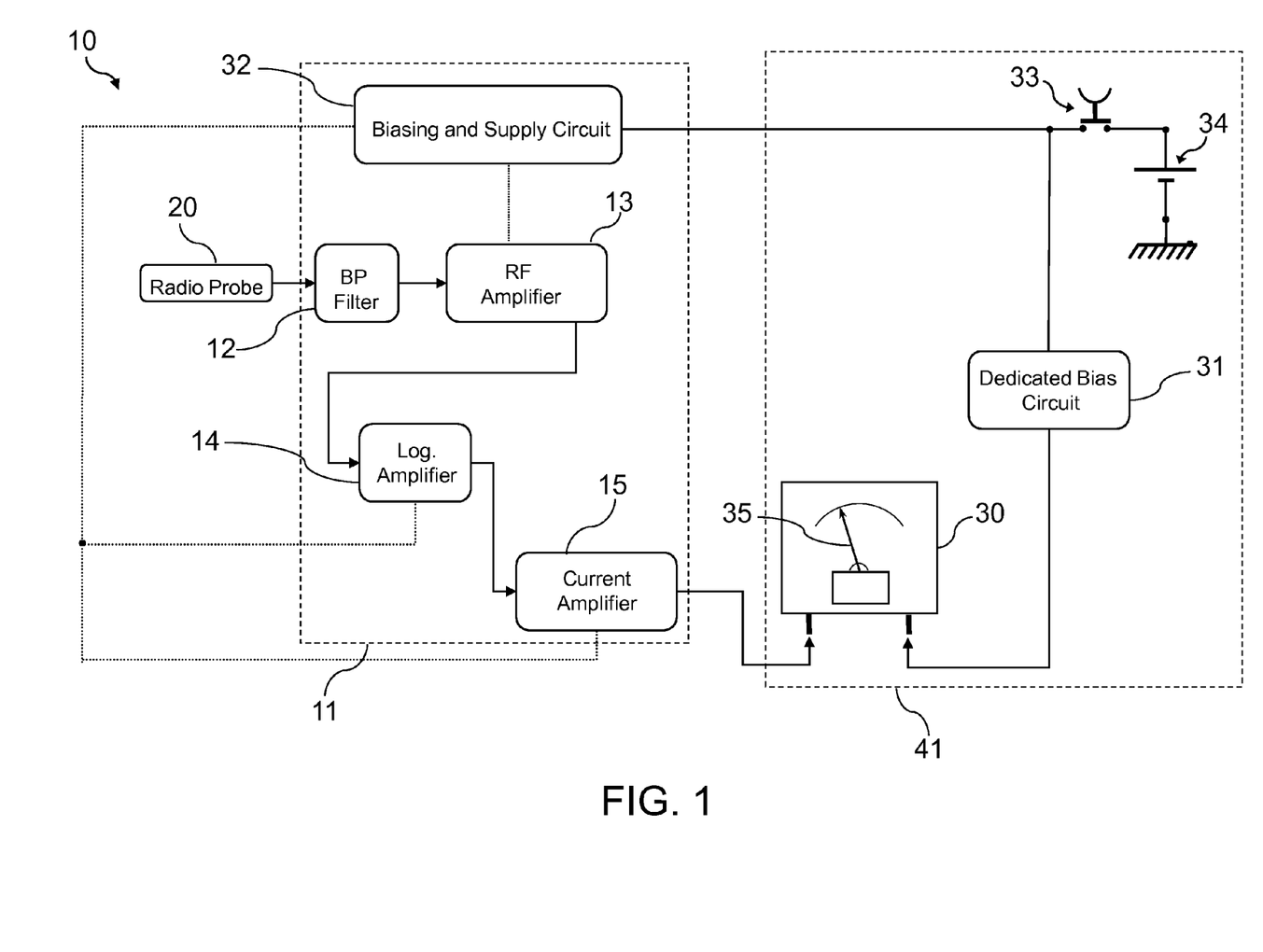
FIG. 1 shows a functional block diagram of an embodiment of a detecting device comprising a radiofrequency probe.
Figure 2:
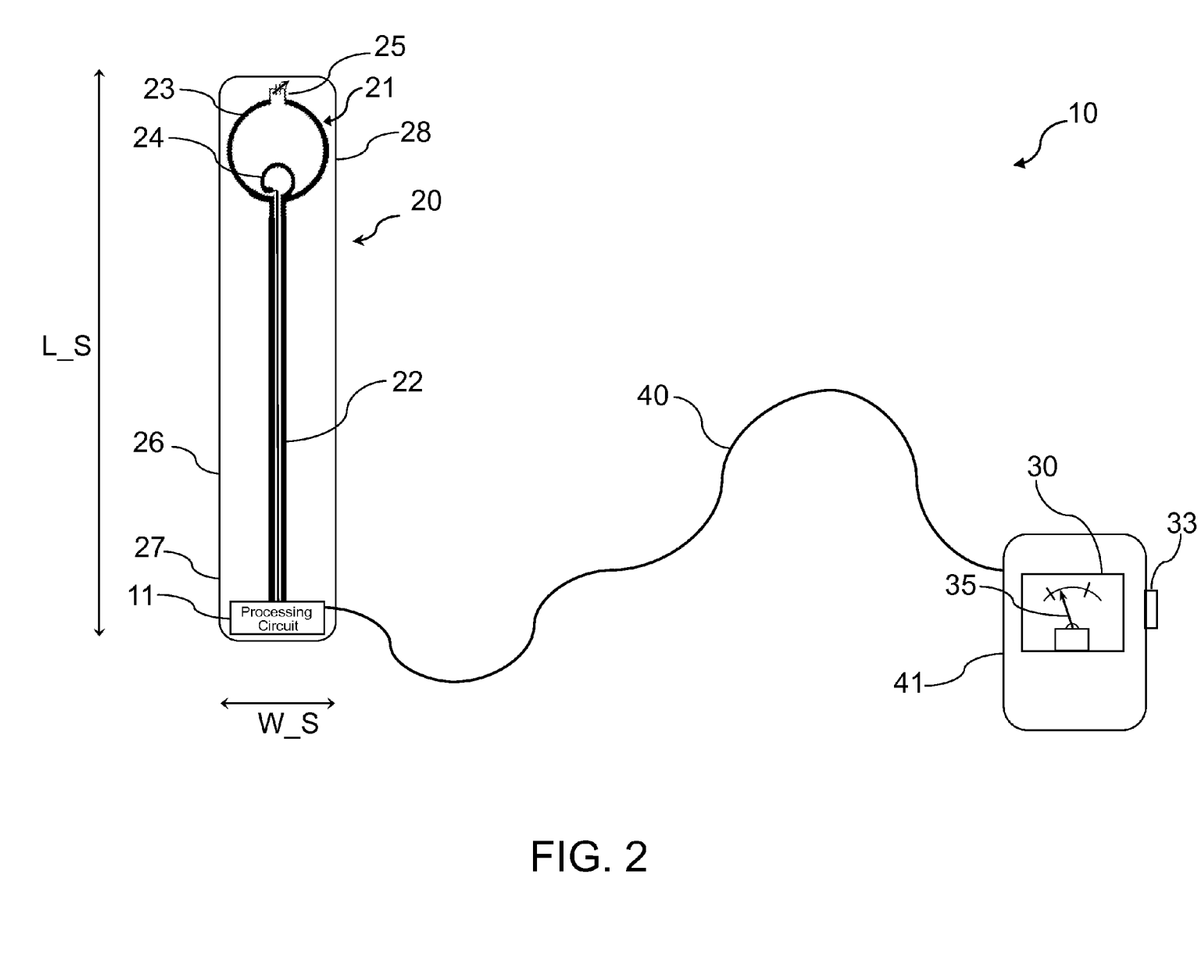
FIG. 2 shows a schematic view of detecting device of FIG. 1.

With reference to FIGS. 1 and 2, reference 10 has been used to generally indicate a handheld detecting device for identifying illicit tampering aimed to alter the metering of a measure—deliverable goods or service.

From now on, in the present description, reference will be made to the illustrative and non limiting case of a measure—deliverable goods or service representing the domestic or industrial distribution of electric energy, for example at low or medium voltage. It is to be noted though that the teachings of the present invention may be extended to different applications, such as in water or gas distribution or for example when illicit tampering involves fuel distribution metering. In the latter case, illicit tampering is committed by distribution operators and damages the purchaser of fuel.

Detecting device 10 is such as to provide the operator, during an inspection at a delivery point, with useful information for detecting the presence of a tampering device that can be remotely controlled by means of a radiofrequency control signal for activating/deactivating the metering alteration. Such tampering device, which is not shown, may be activated/ deactivated for example by means of a manually operated remote control by a user, and may be in particular deactivated by the user in order to avoid that the inspection officer, during the coherence test, may detect an illicit tampering already committed. In order to receive the radiofrequency signal, the tampering device is also provided with or is connected to, a radio receiver. For example, the radio receiver is a super-regenerative receiver, tuned to a frequency of about 434 MHz. In another example, above said super-regenerative radio receiver is tuned to a frequency of about 866 MHz. From now on, reference will be made, without introducing any limitation, to the example of a super-regenerative radio receiver tuned to a frequency of about 434 MHz.

In this case, relating to the distribution of electrical energy, the tampering device is, as an example, a device mounted inside a utility meter, for example of the type similar to the one described in above said European patent application no. EP 1 607 752. In particular, the tampering device is mounted, along with the radio receiver, within the meter housing, and, when active, is such as to alter the metering, so that the utility meter reads a lower energy consumption with respect to the actual one. In another embodiment, the tampering device is placed outside the utility meter, and is parallel connected to the same and, when active, is such as to alter the network configuration near the delivery point in order for the user to obtain a supply of electrical energy bypassing the utility meter. In this case, the tampering device comprises one or more remotely controlled switches or deviator switches which are controlled through said radio receiver for activating/deactivating the bypass connection.

From now on, reference will be made, without limitation, to the case where the tampering devices is housed inside the meter housing and wherein such device is provided for altering the consumption reading of the utility meter.

Figure 3:
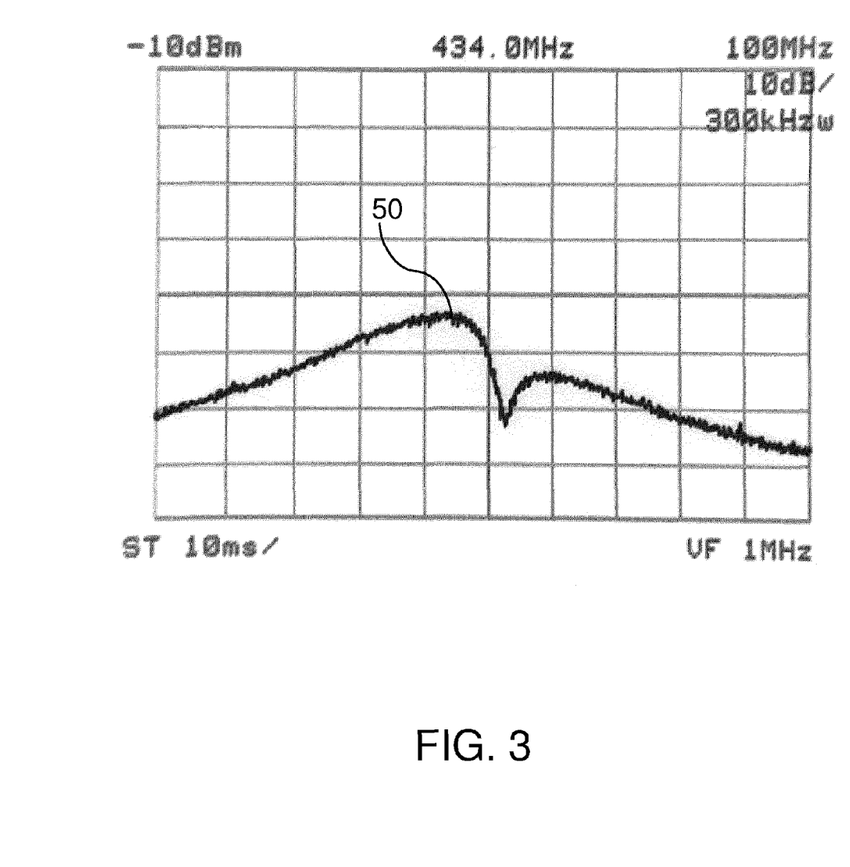
FIG. 3 shows the frequency spectrum of spurious electromagnetic emission produced by a receiver.

The applicant has noted that radio receivers coupled or integrated into the tampering device, provided for receiving radio signals, inherently produce, during normal operation, spurious electromagnetic emissions of very low intensity. In FIG. 3 the frequency spectrum of said spurious emissions, as measured in the case of a super-regenerative receiver tuned to 434 MHz is shown. It may be noted that, in this example, the spectrum of spurious emission has a band of prevalent emission having a peak 50 at about 428 MHz and a bandwidth of about 8-10 MHz.

With reference to FIGS. 1 and 2, the detecting device 10 is a handheld device comprising a radio probe and a signal processing circuit 11. In the present description, a handheld device is a device which may be held by the operator during transportation, handling and operation, using one or both hands.

The radiofrequency probe 20 comprises an antenna for receiving an electromagnetic radiation and for providing an electric radio frequency output signal. The processing circuit 11 is such as to receive an electric radiofrequency signal from antenna, and outputting, based on such electric signal, information useful for detecting the presence of the radio receiver, for example by means of a low frequency electric signal.

In the particular example of FIG. 2, the detecting device 10 also comprises a control and signaling device 41, which is connected to the radiofrequency probe 20 by means of a flexible multipolar cable 40. In this embodiment, which is preferred but not limiting, the processing circuit 11 is fixed, or integrated, with the radiofrequency probe 20, and is protected, as an example, by a metal shielded case. In the embodiment of FIG. 2, the multipolar cable 40 allows operational connection of control and signaling device 41 to processing circuit 11.

Figure 4:
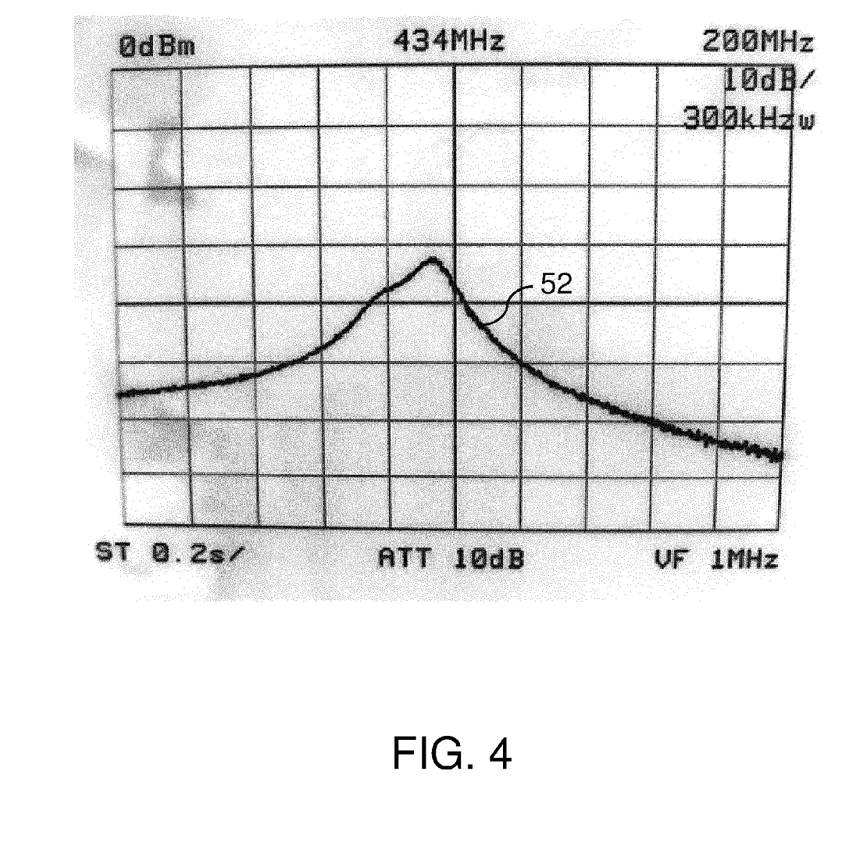
FIG. 4 shows the frequency response function of an antenna of radiofrequency probe of detecting device of FIGS. 1 and 2.

The antenna 21 is provided for frequency selective reception of spurious electromagnetic emissions from the radio receiver in its prevalent emission band. According to an embodiment, the antenna 21 is in particular designed for having a detecting band for selectively receiving, in other words excluding or significantly attenuating the remaining spectrum portions, emissions with a spectrum bandwidth comprised between 5-15 MHz, for example of about 8 or 10 MHz, and a central frequency of about 428 MHz. FIG. 4 shows the frequency response curve 52 of an exemplary magnetic loop antenna 21 manufactured by the applicant, with a peak of 428 MHz, which is approximately the central frequency, and a bandwidth of about 8 MHz.

It is clear that, depending on the type of receiver associated with the tampering device, the central frequency of antenna 21 may be suitably selected during the design phase, for example at about 860 MHz (for detecting the other type of super-regenerative receivers currently available, i.e. receivers tuned to a frequency of 866 MHz).

According to an embodiment, the radiofrequency probe 20 comprises a transmission line 22 for coupling the antenna 21 to the processing circuit 11.

According to an embodiment, the antenna 21 is mostly responsive to a magnetic component of spurious electromagnetic emissions generated by the receiver. In the example, antenna 21 is a magnetic loop antenna comprising an external loop 23, an internal loop 24 and a variable capacitance 25, which may be manually or automatically controlled by means of an electronic control, in order to adjust the tuning of antenna 21.

In the particular example shown, which refers to the situation where the radio receiver coupled to the tampering device is tuned to a frequency of about 434 MHz, the external loop 23 has a diameter of about 3 cm.

According to an embodiment, the antenna 21 is a printed circuit board antenna, which may be for example manufactured by photo-etching of a printed circuit board 26, made of fiberglass. According to an embodiment, if the circuit board antenna is a magnetic loop antenna, the irradiation diagram of antenna in the near field has a direction of maximum directivity which is substantially perpendicular to a plane comprising the circuit board.

According to an embodiment, which is currently preferred, the transmission line 22 is comprised of a coaxial cable, of the so called semi-rigid type, which is directly soldered on board 26. For example, such coaxial cable 22 has a length of about 15 cm.

According to an embodiment, the probe 20 has a generally longitudinal body, wherein the other two dimensions are very small with respect to the longitudinal extension, so that the radiofrequency probe may be easily gripped and moved by an operator for performing local measurements around the housing of the tampering device and in proximity, or in contact, with peripheral walls of said housing. For example, the probe may have a length LS of 20 cm, a width W S of about 4 cm, and a thickness between 0.5 and 2 cm.

said the above mentioned configuration of radiofrequency probe 20, which is therefore a wand or stick, is particularly advantageous, when, as in the example shown, the tampering device is placed inside the housing of the metering device. Such a wand allows the operator to easily sweep the probe 20 along the housing walls of the utility meter, even if the latter is placed inside an electric panel near other metering apparatus, in order to detect faint spurious emissions coming from the radio receiver associated with the tampering device. According to the embodiment shown, the body of the radiofrequency probe 20 comprises a gripping end portion 27 and a second free end portion 28. The antenna 21 is positioned at or near the free end portion 28. Such free end portion 28 therefore represents the sensitive portion of radiofrequency probe 20.

According to another embodiment, the detecting device 10 comprises an acoustic or visual signaling device 30, which is operatively connected to processing circuit 11. In the particular example shown, the detecting device 10 comprises a displaying device 30 integrated in the control and signaling device 41. More in particular, the displaying device 30 comprises an analog pointer indicator 35, whose position is constantly controlled by the processing circuit 11, based on the amplitude of spurious electromagnetic radiation received by the radiofrequency probe 20. Such an indicator 35 may for example be a pointer micro-ammeter with a dedicated bias circuit 31, for zeroing of pointer indicator 35.

According to an embodiment, the processing circuit 11 comprises, in a downstream position with respect to the antenna 21, a signal processing chain 12, 13, 14 sequentially comprising: a bandpass filter 12, a radiofrequency amplifier 13, a logarithmic amplifier 14. According to an embodiment, the processing circuit is provided on a printed circuit board. In the embodiment shown, the printed circuit of the processing circuit 11 is provided on the same base board 26 of antenna 21.

According to an embodiment, the bandpass filter 12 is a passive acoustic surface wave filter. According to an alternate embodiment, the bandpass filter 12 is an adjustable passive double cell filter. Preferably, the band of the bandpass filter 12:

has a bandwidth which is wider than the bandwidth of the detection band of antenna 21; and has falling fronts at the edges of band which are relatively steeper with respect to falling fronts of detection band of antenna 21.

Figure 5:
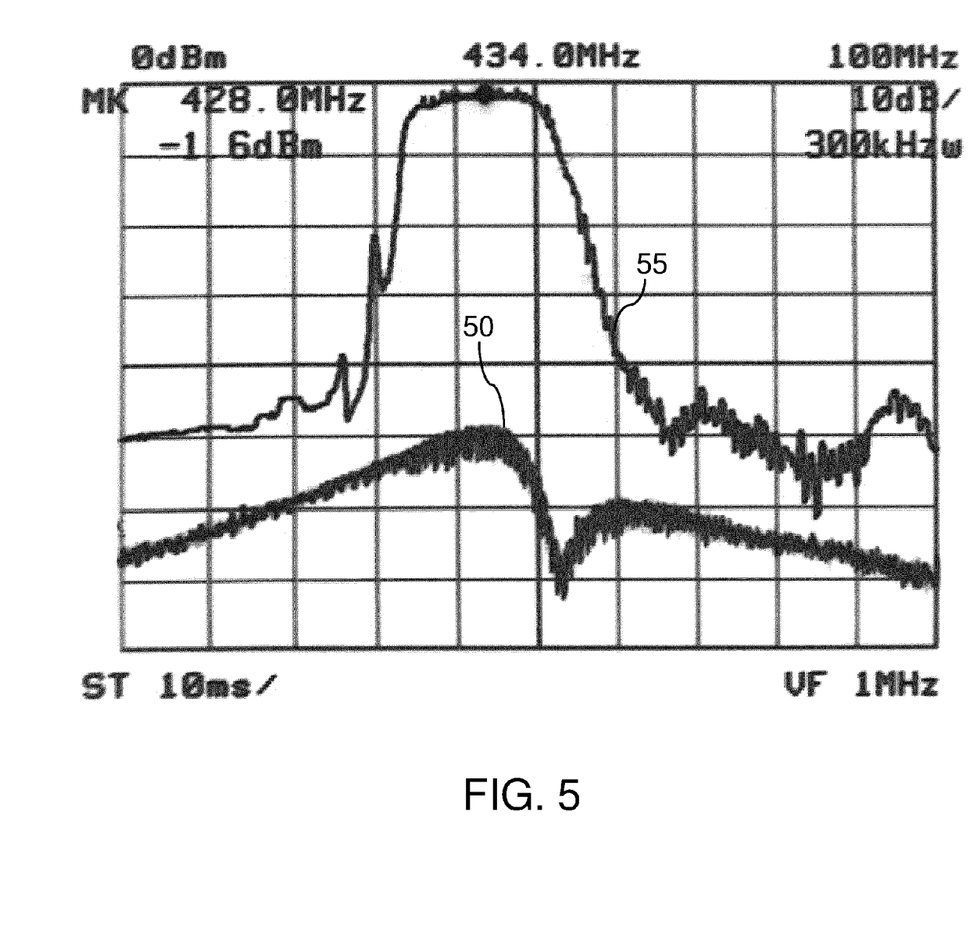
FIG. 5 shows the frequency spectrum of FIG. 3, on which a graph representing the transfer function of a bandpass filter has been superimposed, which may be used in the detecting device of FIGS. 1 and 2.

For example, according to an embodiment, the bandpass filter 12 has a bandpass of about 15 MHz and a central frequency of about 428 MHz. FIG. 5 shows the frequency transfer function 55 of an example of bandpass filter 12, of the acoustic surface wave type, used in a prototype of the handheld detecting device realized by the applicant. In this figure, the transfer function 55 of bandpass filter is superimposed to a spurious emission spectrum, which is similar to the one represented in FIG. 3.

For example, the radiofrequency amplifier 13 is an RF MMIC amplifier (Monolithic Microwave Integrated Circuit).

The logarithmic amplifier 14 is provided for measuring the signal power output by radiofrequency amplifier 13 and providing a low frequency electric output signal, whose instantaneous voltage represents the measured power.

In the embodiment shown in FIG. 1, the processing circuit 11 also comprises a current amplifier 15, which is in fact a linear driver provided for proper driving of analog microammeter 30.

In FIG. 1, according to an embodiment, the detecting device 10 is a self-powered device comprising an internal battery 34 and a biasing and supply circuit 32 of processing circuit 11, which may be activated/deactivated by means of a push button 33, which is normally open. This provides the detecting device 10 with a long lasting charge, since the system absorbs energy from the battery 34, only when the button 33 is pressed by the operator.

Figure 6:
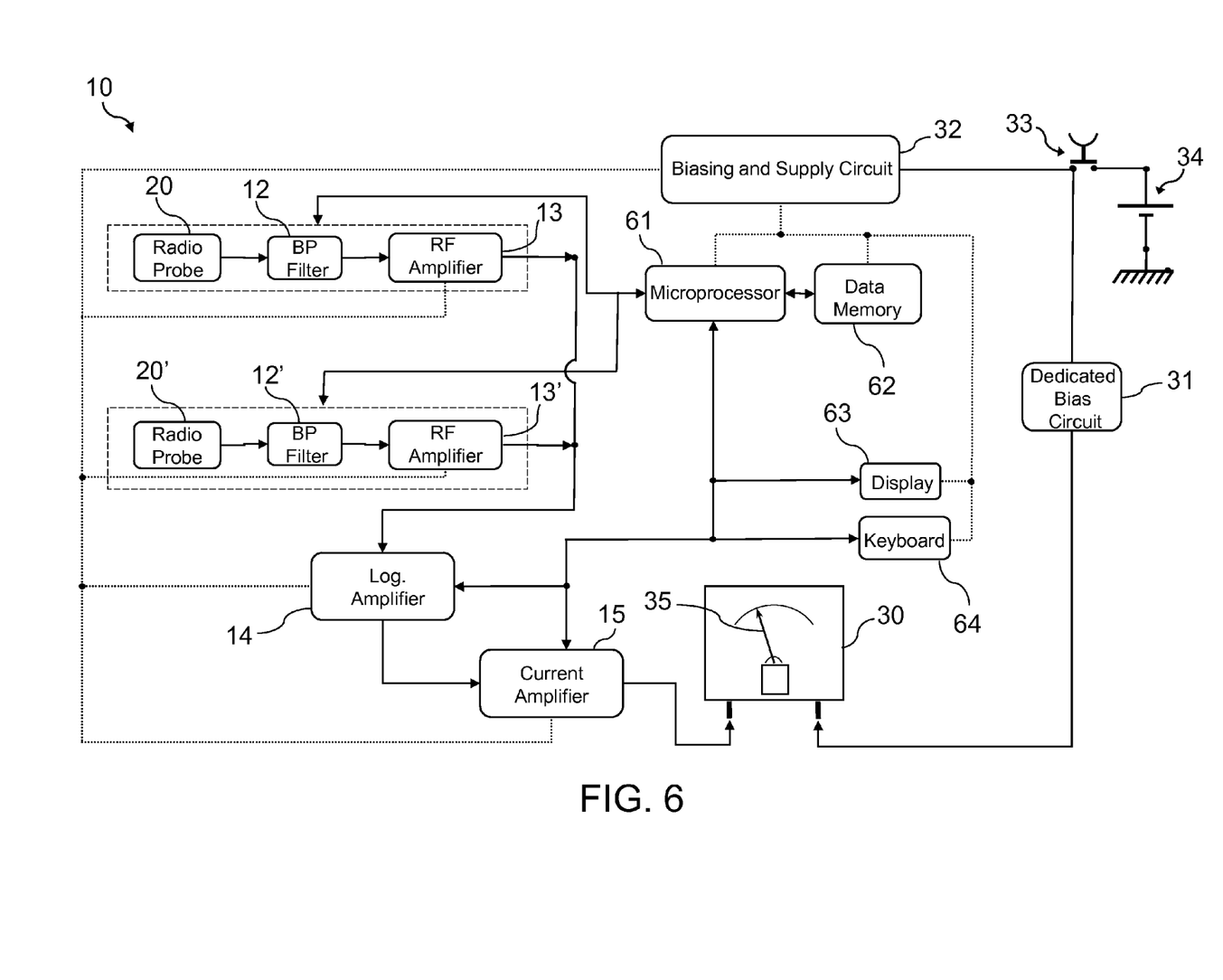
FIG. 6 shows a functional block diagram of a possible modification of detecting device of FIGS. 1 and 2.

With reference to FIG. 6, an alternate embodiment of detecting device of FIG. 1 is shown. In the embodiment of FIG. 6, the detecting device 10 has a double detecting band, since it includes two antennas 20, 20', two bandpass filters 12, 12' and two RF amplifiers 13, 13', in order to detect spurious emissions generated by two different types of radio receivers, which differ from each other because of different prevalent emission bands of spurious electromagnetic radiation, primary because of a different central frequency. The remaining blocks of detecting device 10 of FIG. 6 are similar to those already described for embodiment described with reference to FIGS. 1 and 2, except for the fact that some additional optional blocks have been added. In fact, the following may be provided: a display 63, a keyboard 64, a microprocessor 61 and data memory 62. The microprocessor 61 is such as to selectively activate blocks 20, 12, 13 or 20', 12', 13'. Since in the double band version there may be models of utility meters having spurious emissions in one of detection bands of detecting device 1, it is advantageously possible to provide storage of suitable data into the data memory 62, allowing erroneous detection to be avoided and provide data identifying the meter model to be inserted through keyboard 64 before performing the measurement, in order to avoid that the detecting device 10 signals false positives. Operators may for example verify, using display 63, that identification data entered by means of keyboard are correct and/or that microprocessor 61 may have suppressed a false positive result.

It is to be noted that the embodiment of FIG. 5 may be extended to detecting devices 10 which have more than two detection bands.

By performing experimental fields tests, the applicant, obviously conforming to all necessary privacy and confidentiality requirements, has verified that a detecting device 10 of above said type is able to provide useful information for effectively detecting tampering devices, which are invisible and remotely controlled, even in electromagnetically very noisy environments, thereby fully achieving the objects of the invention. For example, it was possible to detect the presence of a tampering device inside a specific utility meter within an electrical distribution station, comprising various meters placed near above said specific meter.

During above said experimental tests it has been also surprisingly observed that, although the radiofrequency probe 20 has a significant attenuation outside of the relevant band, the detecting device of above said type, in addition to detecting very faint traces of spurious emissions by the radio receiver, shows a certain sensibility also with respect to the signal transmitted by the remote control device, since this signal is much more powerful than said spurious emissions, and, in spite of the attenuation in the radio frequency band of antenna 21, may be detected by detecting device 10, provided that a bandpass filter 12 is used with a bandwidth which does not cause the introduction of further significant attenuation of said signal beyond the attenuation already introduced by antenna 21. In particular, this allowed the applicant to obtain, in some cases, up from the start, information regarding the possible presence of a tampering device, although positioned ad a certain distance from said device, except for the requirement of local measurements in the room, for instance by manually "sweeping", using the radio frequency probe 20, the electrical panel of the utility meter or walls of installation room, in order to pinpoint the exact location of the radio receiver and of associated tampering device.

Obviously, the skilled in the art, in order to fulfill contingent and specific needs, may introduce several modifications and changes to above said detecting device, without leaving the scope of the invention, as defined in the following claims.

The invention claimed is:

1. A detecting device for facilitating detection of tampering aimed at altering metering of a measure-deliverable good or service, for providing useful information for detecting presence of a tampering device adapted to be remotely activated or deactivated by way of a radiofrequency control signal, the tampering device comprising a radio receiver of said radiofrequency control signal, said radio receiver being such to produce faint spurious electromagnetic emissions in a prevalent emission band, the detecting device being a handheld device which can be held by an operator during transportation, handling and operation using one or both hands, comprising:

- at least one radiofrequency probe, provided with an antenna, for frequency selective detection of said faint spurious electromagnetic emissions of said radio receiver, in the prevalent emission band, for providing an electric radiofrequency output signal;
- a signal processing circuit for receiving said electric radiofrequency output signal and outputting, based on said electric radiofrequency output signal, useful information for detecting the presence of the radio receiver.

2. The detecting device according to claim 1, wherein said antenna is prevalently responsive to a magnetic component of said spurious electromagnetic emissions.

3. The detecting device according to claim 2, wherein said antenna is a magnetic loop antenna.

4. The detecting device according to claim 1, wherein the antenna is a printed circuit antenna.

5. The detecting device according to claim 3, wherein said antenna has an irradiation diagram with a maximum directivity direction substantially perpendicular to a plane containing said printed circuit antenna.

6. The detecting device according to claim 1, wherein the at least one radiofrequency probe may be handheld by an operator and comprises a body having a first dimension along its prevalent longitudinal direction, said body having two other dimensions significantly smaller than the first dimension, so that the at least one radiofrequency probe may be easily held and moved about by the operator, in order to perform local measurements around a housing of the tampering device and in proximity or in contact with peripheral walls of said housing.

7. The detecting device according to claim 6, wherein said body of the at least one radiofrequency probe is configured as a wand or a stick and comprises a gripping end portion and a second opposite free end portion, and wherein the antenna is positioned at or near said second opposite free end portion.

8. The detecting device according to claim 1, wherein the antenna has a bandpass of 5 MHz-15 MHz around a central frequency of about 428 MHz and/or 860 MHz.

9. The detecting device according to claim 8, wherein said bandpass is equal to about 8 MHz.

10. The detecting device according to claim 1, further comprising an acoustic or visual signaling device operatively connected to said signal processing circuit.

11. The detecting device according to claim 10, wherein the acoustic or visual signaling device comprises an analog pointer indicator, whose position is constantly controlled by the signal processing circuit based on a detected amplitude of said faint spurious electromagnetic emissions.

12. The detecting device according to claim 1, wherein the signal processing circuit comprises a processing chain, sequentially comprising, in a downstream position with respect to said antenna: a bandpass filter, a radiofrequency amplifier and a logarithmic amplifier.

13. The detecting device according to claim 12, wherein said bandpass filter is an acoustic surface wave filter.

14. The detecting device according to claim 1, wherein the detecting device is self-powered and comprises an internal battery and also comprises a biasing and power supply circuit of processing circuit, which may be activated or deactivated by way of a normally open push button.

15. An inspection method for detecting illicit tampering aimed at altering metering of a measure-deliverable good or service, performed by a tampering device that can be remotely activated or deactivated by means of a radiofrequency control signal, the inspection method comprising:

- performing a detection at a delivery point of said measure-deliverable good or service by the detecting device according to claim 1,
- positioning and manually sweeping said at least one radiofrequency probe of the detecting device near walls of a user or distribution meter and/or walls of a housing of said user or distribution meter and/or walls of an installation room of said user or distribution meter, and
- pinpointing an exact location of said tampering device by detecting the presence and installation position of said radio receiver through information provided by said detecting device.

* * * * *